(12) United States Patent
Ohyagi

(10) Patent No.: US 6,951,788 B2
(45) Date of Patent: Oct. 4, 2005

(54) METHOD OF MANUFACTURING SEMICONDUCTOR DEVICE

(75) Inventor: Nobutaka Ohyagi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 344 days.

(21) Appl. No.: 10/349,312

(22) Filed: Jan. 23, 2003

(65) Prior Publication Data

US 2003/0211685 A1 Nov. 13, 2003

(30) Foreign Application Priority Data

May 10, 2002 (JP) .................................... 2002-135075

(51) Int. Cl.[7] .......................................... H01L 21/8242
(52) U.S. Cl. .......................................... 438/240; 438/3
(58) Field of Search .................... 438/3, 238–241, 438/393–399, 245–256

(56) References Cited

U.S. PATENT DOCUMENTS 5,416,042 A    5/1995   Beach et al.
6,469,333 B1  10/2002   Takai et al.
6,579,753 B2 *  6/2003  Yamanobe ................... 438/240

FOREIGN PATENT DOCUMENTS

| JP | 6-290984  | 10/1994 |
| JP | 3056973   | 4/2000  |
| JP | 2001-44375 | 2/2001 |

* cited by examiner

*Primary Examiner*—H. Jey Tsai
(74) *Attorney, Agent, or Firm*—Westerman, Hattori, Daniels & Adrian, LLP

(57) ABSTRACT

There is provided a semiconductor device manufacturing method which comprises a step of forming titanium silicide layers (conductive patterns) on a silicon substrate (semiconductor substrate), a step of forming a cover insulating film (underlying insulating film), a step of forming a laminated film containing an alumina film (metal oxide film) on the cover insulating film, a first etching step of forming first holes in the laminated film by etching the laminated film, a cleaning step of cleaning the first holes, and a second etching step of forming second holes in the cover insulating film by etching the cover insulating film via the first holes under second etching conditions after the cleaning step.

17 Claims, 15 Drawing Sheets

First etching step

Second etching step

First etching step

Cleaning step

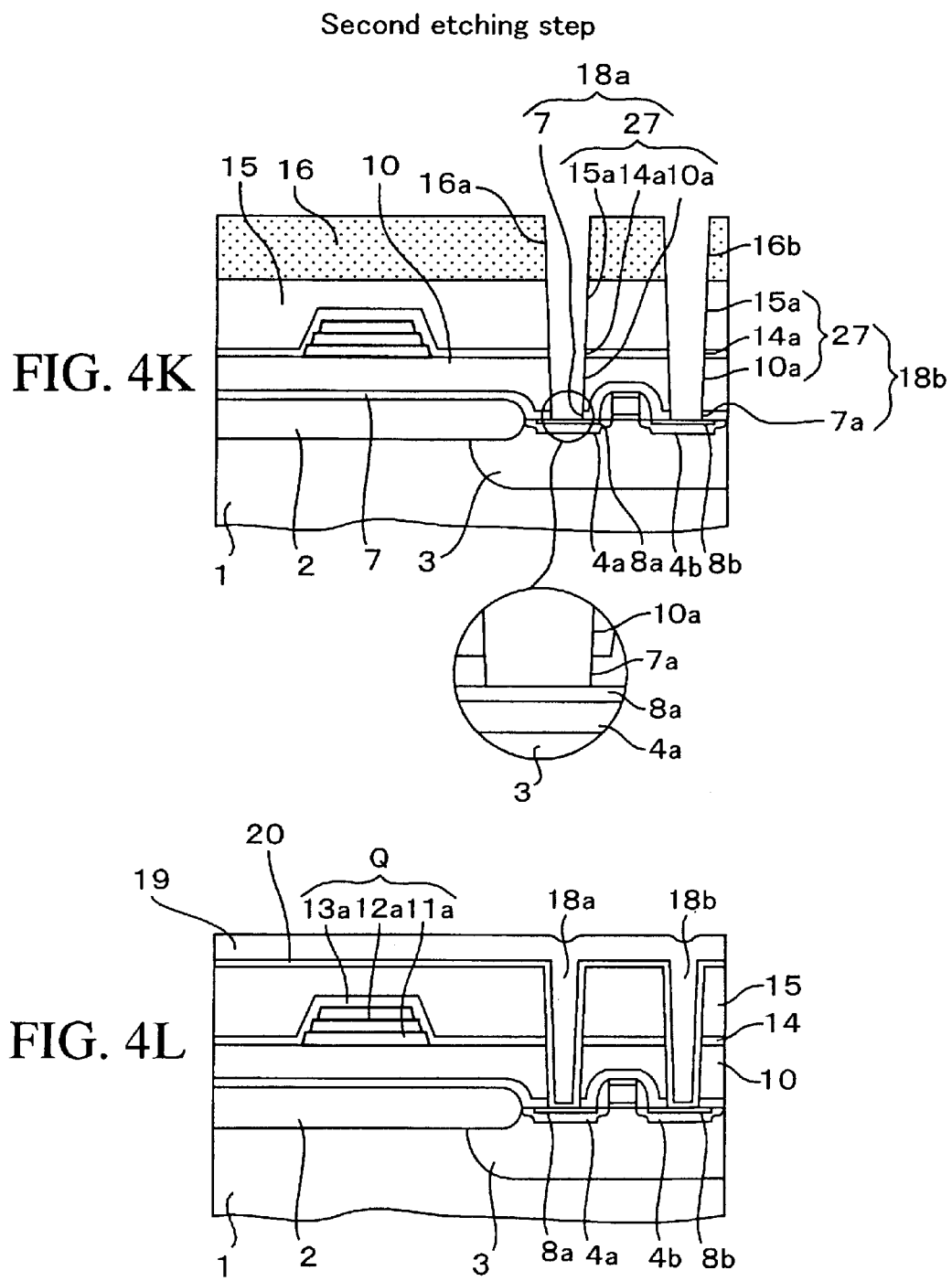

METHOD OF MANUFACTURING SEMICONDUCTOR DEVICE

CROSS-REFERENCE TO RELATED APPLICATIONS

This application is based upon and claims priority of Japanese Patent Application No.2002-135075, filed on May 10, 2002, the contents being incorporated herein by reference.

BACKGROUND OF THE INVENTION

1. Field of the Invention

The present invention relates to a method of manufacturing a semiconductor device and, more particularly, to a method of manufacturing a semiconductor device having a nonvolatile memory (FeRAM: Ferroelectric Random Access Memory) that employs a ferroelectric material as a capacitor dielectric film.

2. Description of the Related Art

With the progress in size reduction and higher performance of the electronic equipment in recent years, the higher integration is required for the semiconductor devices mounted in such equipment. The semiconductor device having FeRAM is one of such semiconductor devices, for which the shrieked cell area is required.

Conventional method of manufacturing the FeRAM will be explained with reference to FIGS. 1A to 1C and FIG. 2 hereunder.

First, steps required to obtain the sectional structure shown in FIG. 1A will be explained hereunder. In order to get this structure, an device isolation insulating film 2 and a p-well 3 are formed on a silicon substrate 1, and then a MOSFET is fabricated on the p-well 3 by the well-known method. The MOSFET is constructed by n-type impurity diffusion regions 4a, 4b serving as the source/drain regions, conductor patterns made of titanium silicide (TiSi) layers 8a, 8b formed on surface layers of the n-type impurity diffusion regions 4a, 4b respectively, a gate insulating film 5, a gate electrode 6, sidewall insulating films 9 formed on both side of the gate electrode 6, etc. Then, a cover insulating film 7 made of silicon oxide nitride (SiON) is formed to cover the MOSFET, and a first insulating film 10 made of silicon oxide (SiO$_2$) is formed thereon.

Formed on the first insulating film is a capacitor Q, which is constructed by sequentially laminating a capacitor lower electrode 11a, a capacitor dielectric film 12a, and a capacitor upper electrode 13a.

Out of them, the property of the capacitor dielectric film 12a deteriorates when the film 12a is exposed to hydrogen, which has reducing property and is contained in the process troposphere for forming an insulating film over the film 12a.

In order to prevent this deterioration, the capacitor Q is usually covered with a metal oxide film such as an alumina (Al$_2$O$_3$) film 14, or the like to prevent the entering of the hydrogen into the capacitor Q. The structure for protecting the capacitor Q by the metal oxide film is disclosed in Patent Application Publication (KOKAI) 2001-44375, Patent Application Publication (KOKAI) Hei 6-290984, Patent No.3056973.

Then, a second insulating film 15 made of silicon oxide is formed on the alumina film 14. Then, resist 25 is formed thereon, and hole forming windows 25a, 25b are formed by patterning the resist 25.

Then, as shown in FIG. 1B, the second insulating film 15, the alumina film 14, and the first insulating film 10 are etched in one step by the RIE (Reactive Ion Etching) while using the resist 25 as an etching mask and using the cover insulating film 7 as an etching stopper film. Thus, holes 15a, 14a, 10a are formed in above films respectively. In the following, such a etching step is called as the first etching step.

Then, as shown in FIG. 1C, the etching gas is changed, and then the cover insulating film 7 is etched by the RIE while using the resist 25 as the etching gas. Thus, holes 7a are formed in the cover insulating film 7, so that contact holes 18a, 18b each consisting of the holes 15a, 14a, 10a, 7a are formed. This etching step is called the second etching step in the following.

Meanwhile, it is preferable in the above second etching step that the sufficiently large selective etching ratio of the cover insulating film 7 to the titanium silicide layers 8a, 8b be ensured, so that the etching can be stopped on surfaces of the titanium silicide layers 8a, 8b.

However, the above etching method cannot ensure the sufficiently large selective etching ratio, and thus the etching of the titanium silicide layer 8a is caused, as shown in a circle of FIG. 1C. In the extreme case, as shown in FIG. 2, the titanium silicide layer 8a is perfectly removed by the etching.

When the titanium silicide layers 8a, 8b are etched in this manner, contact resistances between conductive plugs (not shown), which are buried in the contact holes 18a, 18b later, and the titanium silicide layers 8a, 8b are not stabilized. Therefore, such a disadvantage is caused that values of the contact resistance are varied by respective conductive plugs.

SUMMARY OF THE INVENTION

It is an object of the present invention to provide a method of manufacturing a semiconductor device capable of ensuring a sufficiently large selective etching ratio between a conductor pattern, which is made of an alloy consisting of a semiconductor and a refractory metal, and an underlying insulating film, in the case where a laminated film containing a metal oxide film is etched and then the underlying insulating film is etched.

According to one aspect of the present invention to provide a method of manufacturing a semiconductor device comprising the steps of: forming conductive patterns made of alloy consisting of semiconductor and refractory metal on a semiconductor substrate; forming an underlying insulating film to cover the conductive pattern; forming a laminated film containing a metal oxide film on the underlying insulating film; a first etching step of forming first holes in the laminated film over the conductive pattern by etching selectively the laminated film under first etching conditions; a cleaning step of cleaning the first holes; and a second etching step of forming second holes in the underlying insulating film to expose the conductive pattern by etching selectively the underlying insulating film via the first holes under second etching conditions after the cleaning step.

Next, advantages of the present invention will be explained hereunder.

According to the present invention, the first hole is formed in the laminated film containing the metal oxide film in the first etching step, then the reactant product that is deposited in the first hole by the reaction between the metal oxide and the etching gas in the first etching step is removed by the cleaning in the cleaning step, and then the second hole is formed by etching the underlying insulating film via the first hole in the second etching step.

According to this, even when the metal oxide film is formed thick and much reactant product is produced, such reaction product is removed. Thus, the oxygen is not supplied to the etching atmosphere in the second etching step from the reactant product. Therefore, it is prevented that the amount of the carbon polymer in the etching atmosphere reduces due to excessive oxidation of the carbon polymer by oxygen. As a result, due to the function of the above polymer, the selective etching ratio between the underlying insulating film and the conductive patterns can be ensured sufficiently largely in the second etching step, regardless of the film thickness of the metal oxide film.

Therefore, even when the cell area of the FeRAM shrinks and thus the metal oxide film is formed thick, the etching of the conductive patterns in the second etching step can be prevented. As a result, the conductive plugs, which are buried in the first hole and the second hole, and the conductive pattern can be electrically connected satisfactorily, and it can be prevented that the contact resistance between them is varied in each conductive plug.

Also, it is preferable that the first etching step be executed by forming the resist pattern on the laminated film and then etching selectively the laminated film while using the resist pattern as the etching mask. In this case, since the cleaning step and the second etching step are carried out successively under the condition where the resist pattern is not removed but remains on the upper surface of the laminated film, the etching of the upper surface of the laminated film in the second etching step can be prevented. In addition, though another resist pattern, aligned with the first and second hole, must be formed again on the laminated film if the aforementioned resist pattern is removed before the cleaning step or the second etching step, the present invention is free from such a need to perform the difficult positional alignment.

Further, since the above metal oxide film is formed to have the double-layered structure consisting of the first metal oxide film and the second metal oxide film, the entering of the hydrogen into the capacitor can more surely be prevented. In addition, when such metal oxide film having the double-layered structure is formed, the first conductive film is patterned into the capacitor lower electrode in the situation where the side surface of the capacitor dielectric film are covered with the first metal oxide film. Therefore, particles that are generated at the time of patterning can be prevented from adhering onto the side surface of the capacitor dielectric film, and thus the electrical short-circuit between the capacitor lower electrode and the capacitor upper electrode caused by such particles can be prevented.

DESCRIPTION OF THE PREFERRED EMBODIMENTS

Next, embodiments of the present invention will be explained in detail with reference to the accompanying drawings hereinafter.

Figure 1A:
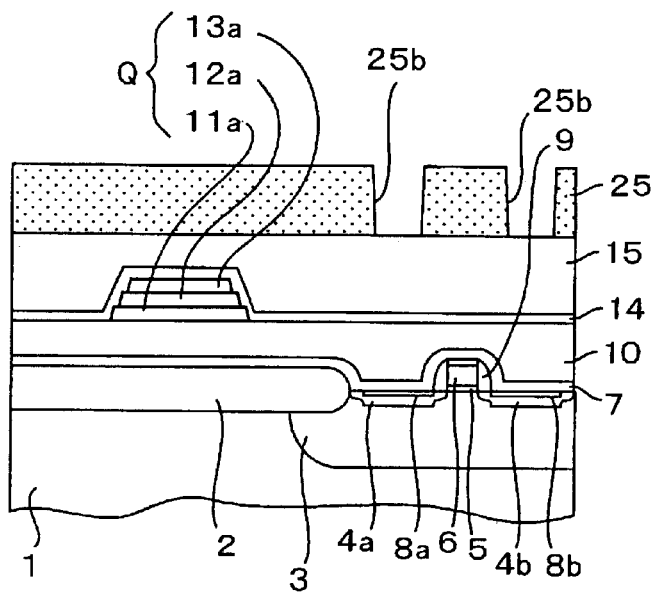
FIGS. 1A to 1C and FIG. 2 are sectional views showing a semiconductor device manufacturing method in the prior art.
Figure 1B:
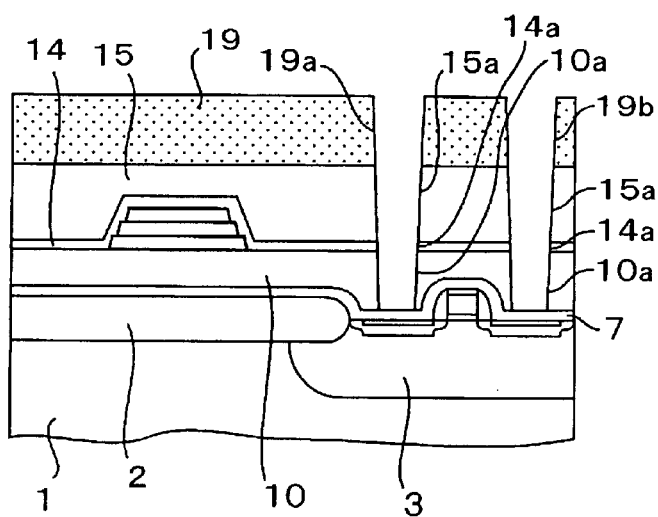
Figure 1C:
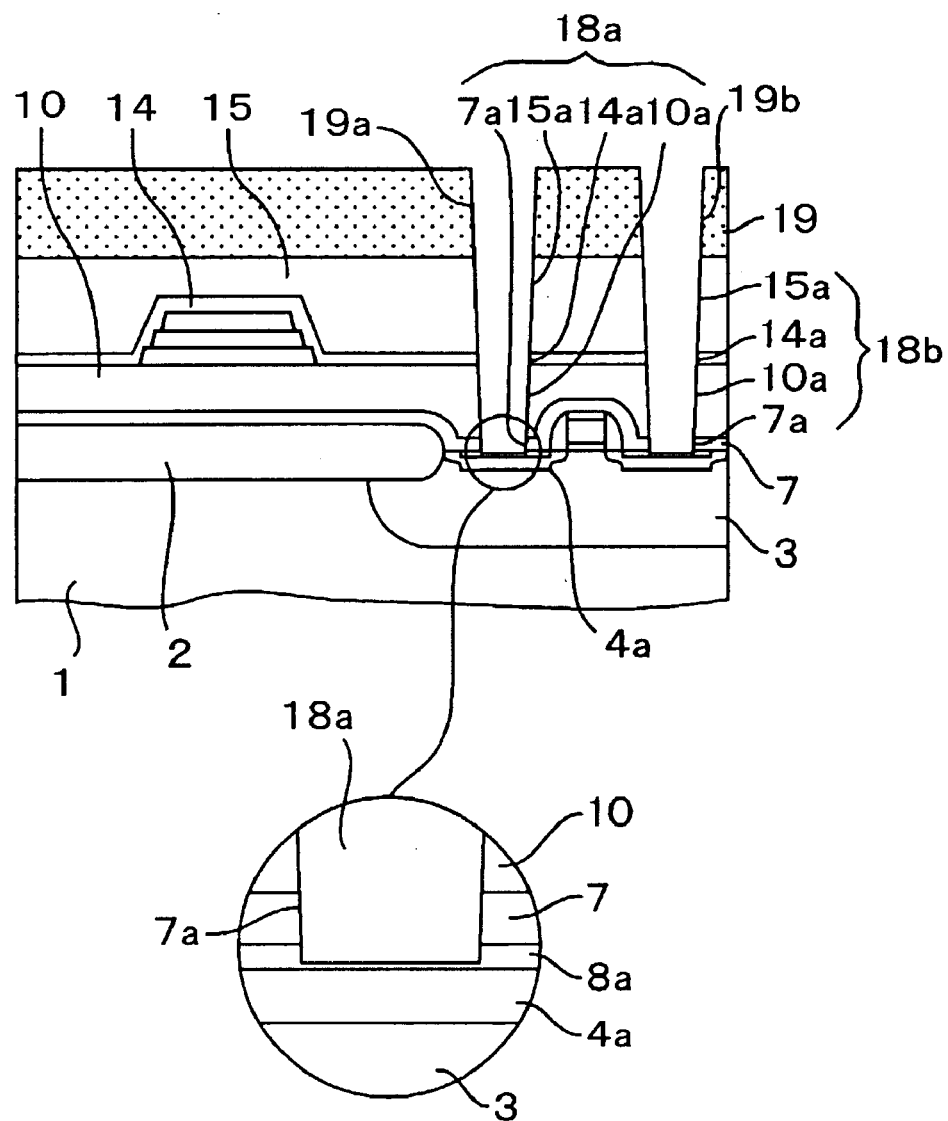
Figure 2:
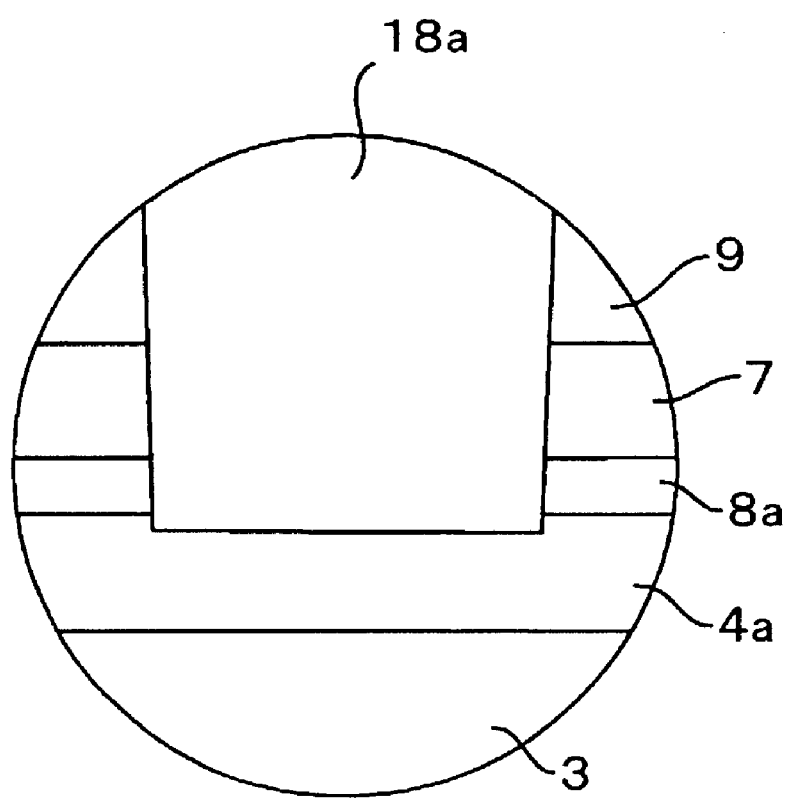

The inventor of the present invention have considered the reason why the selective etching ratio between the cover insulating film 7 and the titanium silicide layer 8a cannot be enssured in the second etching step in FIG. 1C in the prior art as follows.

The second etching step is carried out by RIE. In this RIE, the carbon polymer being generated from the CF gas in the etching gas is deposited on bottoms of the contact holes 18a, 18b, and this polymer plays the role of enhancing the selective etching ratio between the cover insulating film 7 and the titanium silicide layers 8a, 8b.

Therefore, the reason why the selective etching ratio cannot be ensured as above may be considered that an amount of the carbon polymer lacks for some reasons. As one of the reasons, it may be considered that the etching gas reacts with the alumina at the time of etching the alumina film 14 in the first etching step (see FIG. 1B) and then the reactant product generated at this time is deposited onto inner walls of each holes 10a, 14a, 15a. Actually, if the second etching step is carried out in the state that the reactant product is present, the oxygen is supplied to the etching gas from the reactant product and thus the above polymer is oxidized by the oxygen to become CO, etc., so that an amount of the polymer is reduced. Therefore, the selective etching ratio between the cover insulating film 7 and the titanium silicide layer 8a is lowered.

It should be noted the fact that the oxygen is supplied to the etching atmosphere from the reactant product is presumed based on the fact that the titanium silicide layer 8a was not etched unlike the above when the aluminum film is formed in place of the alumina film 14 and that the oxygen is not contained in the aluminum in contrast to the alumina. As a consequence, it may be supposed that if other metal oxide film is employed in place of the alumina film, disadvantages similar to the above are caused.

Figure 3:
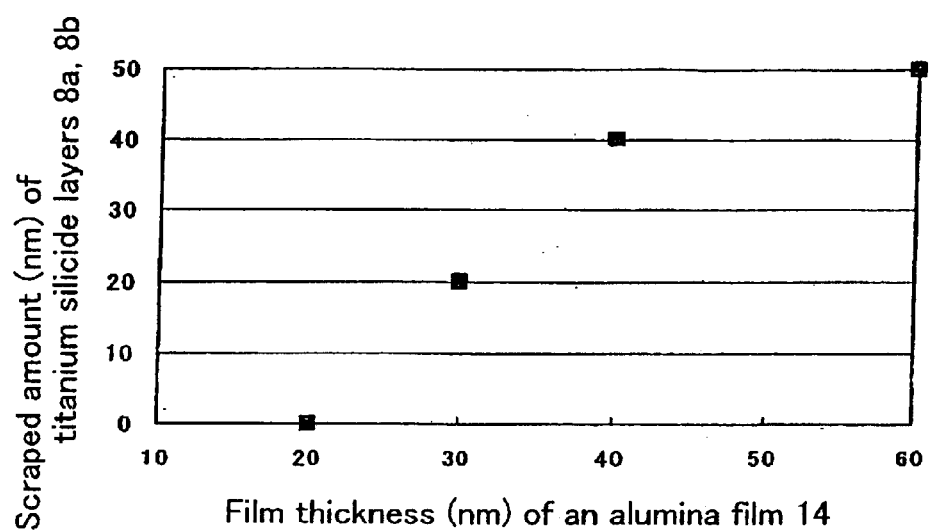
FIG. 3 is graph showing experimental results of a relationship between a film thickness of an alumina film and a scraped amount of titanium silicide layers in the semiconductor device manufacturing method in the prior art.

In addition, according to the experiment made by the inventor of the present invention, it was verified that the thicker the alumina film 14 became, the larger the level of reduction in the selective etching ratio became. Such an experimental results are shown in FIG. 3.

In this experiment, film thicknesses of each film were set as follows:

Titanium silicide layers 8a, 8b . . . 50 nm

Cover insulating film 7 . . . 200 nm

First insulating film 10 . . . 600 nm

Alumina film 14 . . . 20, 30, 40, 60 nm (varying film thickness)

Second insulating film 15 . . . 1100 nm.

Then, in this experiment, the over-etching (excessive etching) corresponding to 300 nm, which is deeper than the film thickness of the cover insulating film 7, was performed for the film 7 in the second etching step. Then, a scraped amount (etching amount) of the underlying titanium silicide layers 8a, 8b was examined.

As apparent from FIG. 3, a scraped amount of the underlying titanium silicide layer 8 was 0 nm when the film thickness of the alumina film 14 was 20 nm. However, it can be seen that a scraped amount is increased by about 20 nm every time when the film thickness is increased by 10 nm.

The reason for this may be considered that an etching amount of the alumina is increased as the film thickness of the alumina film 14 is becomes thicker, then the reactant product is produced much more correspondingly in the first etching step, then an amount of oxygen supplied from the reactant product to the etching atmosphere is increased, and then the above carbon polymer is reduced much more by the oxygen.

Also, the selective etching ratios between the cover insulating film 7 and the titanium silicide layers 8a, 8b in this case are shown in Table 1.

TABLE 1

| Film thickness of the alumina film 14 (nm) | Selective etching ratio |
|---|---|
| 20 nm | more than 10 |
| 30 nm | 5 |
| 40 nm | 2.5 |
| 60 nm | less than 2 |

Selective Etching Ratio=(etching rate of the cover insulating film 7)/(etching rate of the titanium silicide layers 8a, 8b)

It is preferable that the selective etching ratio of more than 5 be ensured in practical use. To this end, as seen in Table 1, the film thickness of the alumina film 14 must be less than 30 nm. This means that an upper limit is imposed on the film thickness of the alumina film 14.

However, since the capacitor Q tends to be deteriorated much more by the hydrogen when the cell area is reduced in future, the film thickness of the alumina film 14 must be increased thicker to prevent the deterioration. In this case, if the upper limit is imposed on the film thickness as described above, such a disadvantage is caused that the cell area cannot be reduced desirably.

In view of the above consideration, it may be concluded that in order to overcome the problem in the prior art, the second etching step is carried out after the reactant product in the first etching step is removed. Their details will be explained in detail with reference to respective embodiments hereinafter.

(1) First Embodiment

Figure 4A:
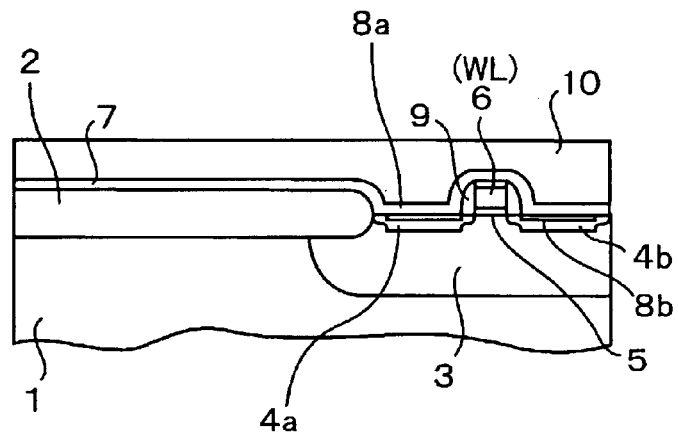
FIGS. 4A to 4Q are sectional views showing a semiconductor device manufacturing method according to a first embodiment of the present invention.
Figure 4B:
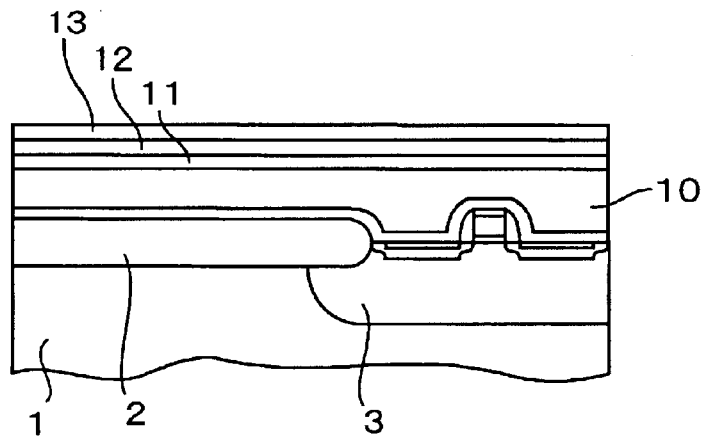
Figure 4C:
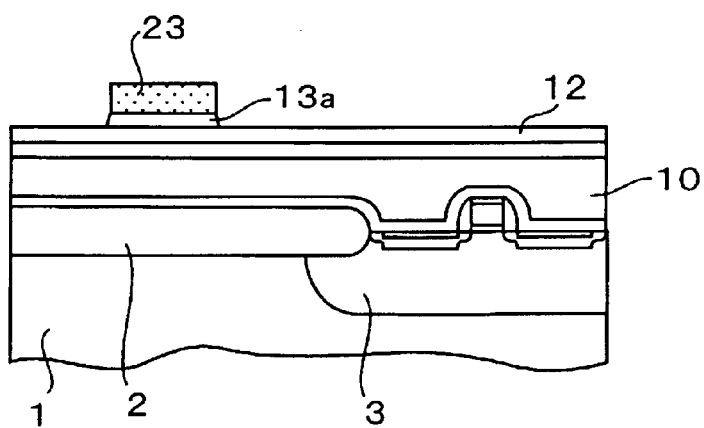
Figure 4D:
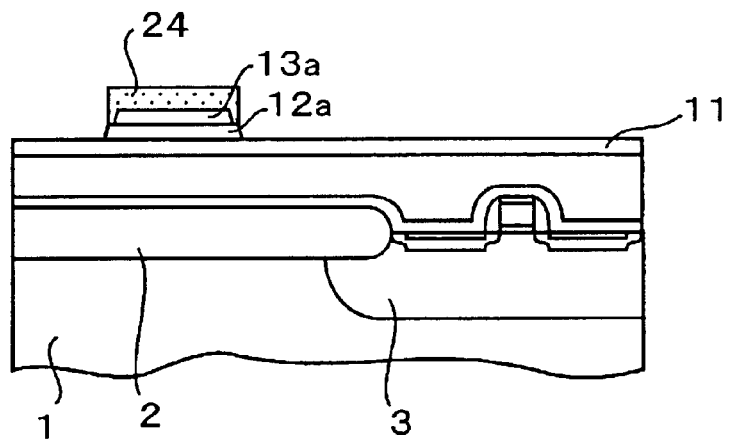
Figure 4E:
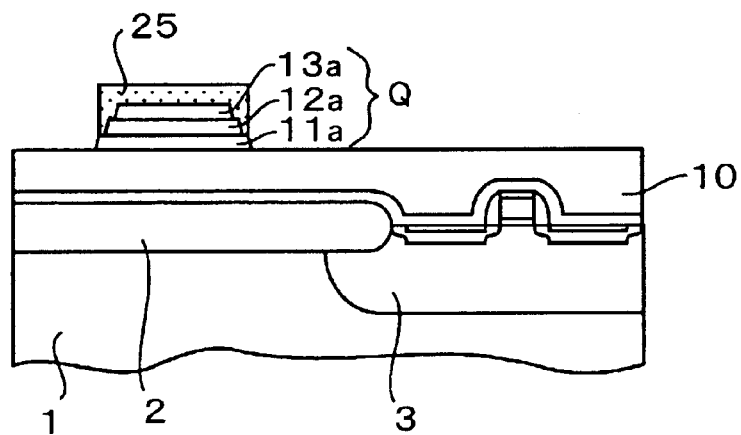
Figure 4F:
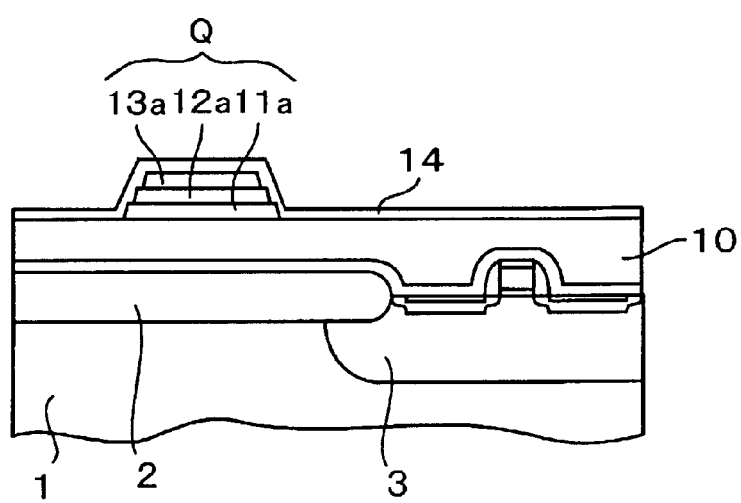
Figure 4G:
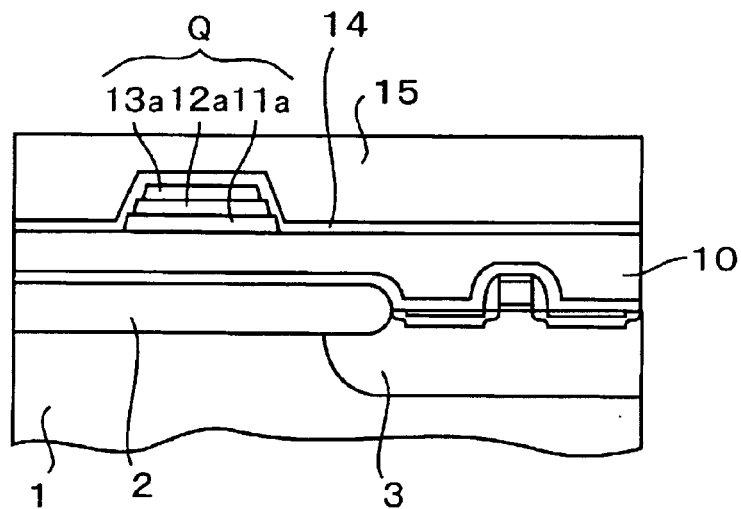
Figure 4H:
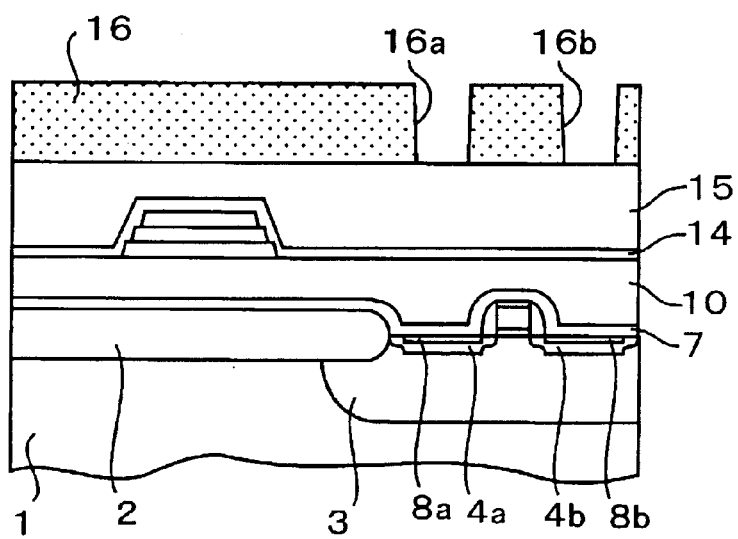
Figure 4I:
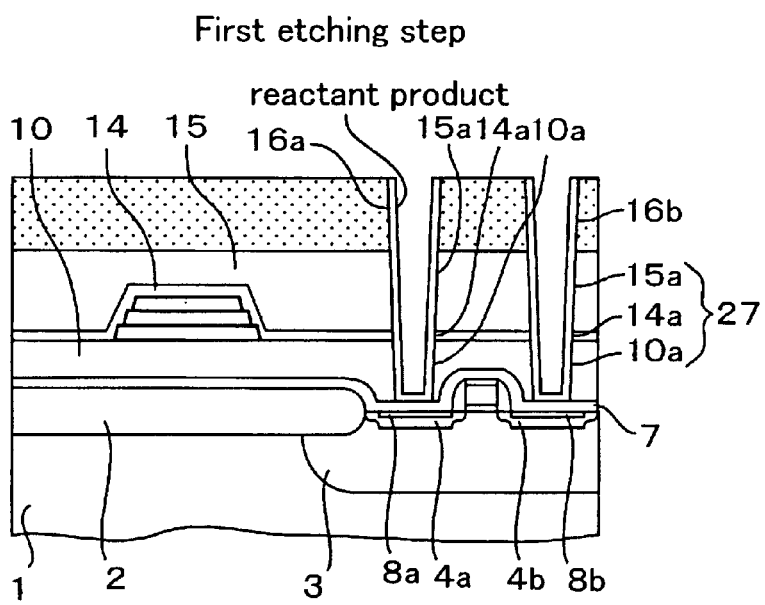
Figure 4J:
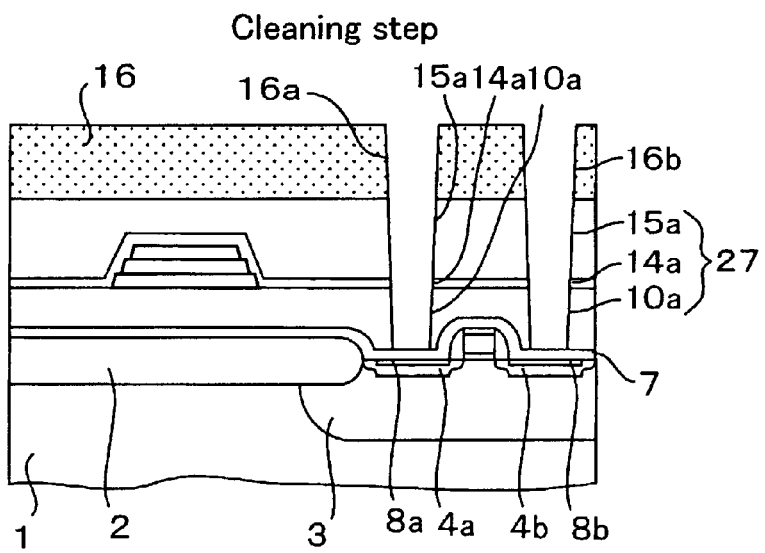
Figure 4M:
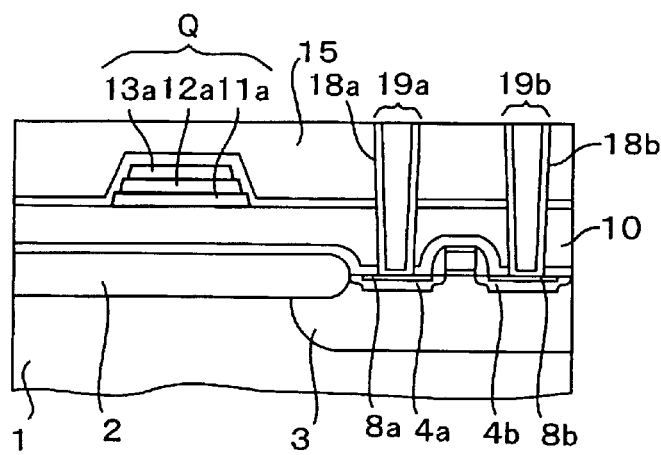
Figure 4N:
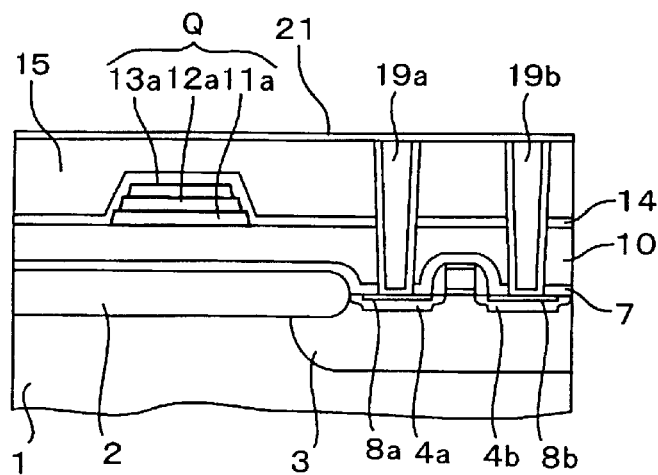
Figure 4O:
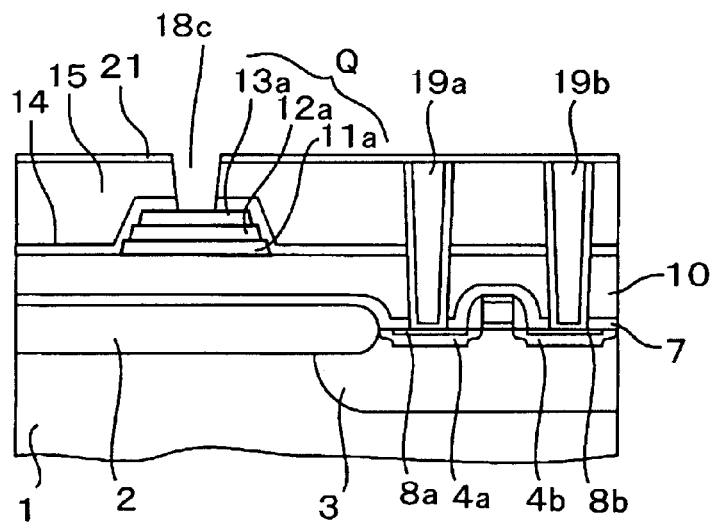
Figure 4P:
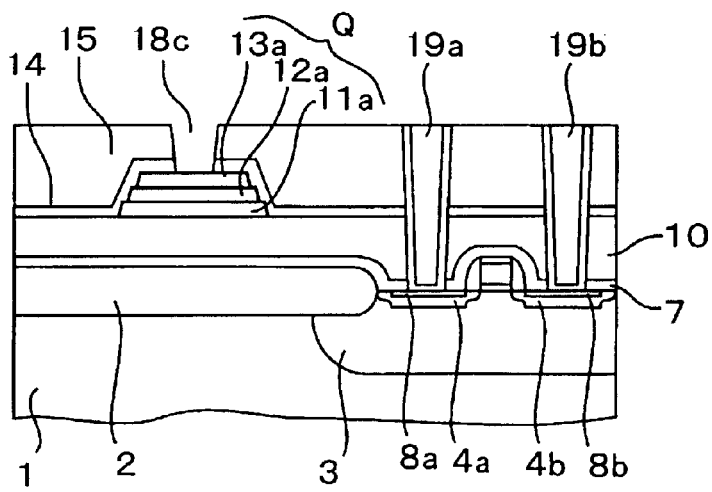
Figure 4Q:
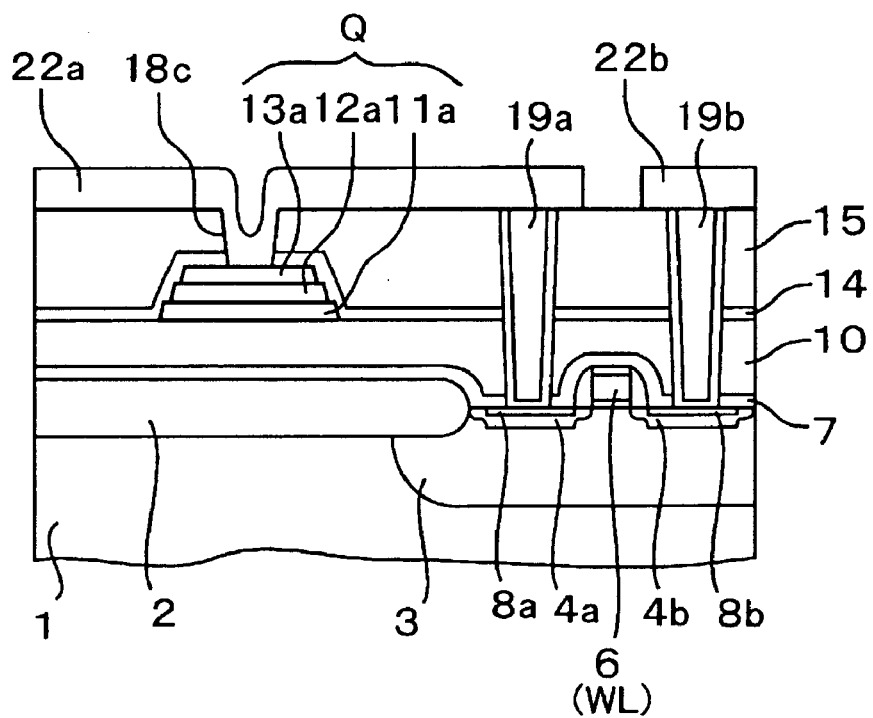

FIGS. 4A to 4Q are sectional views showing in sequence a method of manufacturing a semiconductor device according to a first embodiment of the present invention.

First, steps required until a sectional structure shown in FIG. 4A is obtained will be explained hereunder.

As shown in FIG. 4A, a device isolation insulating film 2 is formed on a surface of an n-type or p-type silicon (semiconductor) substrate 1 by the LOCOS (Local Oxidation of Silicon) method. As the device isolation insulating film 2, the STI (Shallow Trench Isolation) method may be employed other than the LOCOS method.

After such device isolation insulating film 2 is formed, a p-well 3 is formed by introducing the p-type impurity into a predetermined active region (transistor forming region) of the silicon substrate 1.

Thereafter, a silicon oxide film is formed as a gate insulating film 5 by thermally oxidizing the surface of the active region of the silicon substrate 1.

Then, a laminated film having a double-layered structure consisting of an amorphous silicon or polysilicon film and a tungsten silicide layer is formed on an overall upper surface of the silicon substrate 1. Then, resistance of the laminated film is reduced by ion-implanting the n-type impurity into the laminated film. Thereafter, a gate electrode 6 having a polycide structure constituting a part of the word line WL is formed by patterning the laminated film into a predetermined shape by virtue of the photolithography method.

Subsequently, n-type impurity diffusion regions 4a, 4b serving as the source/drain of the n-channel MOSFET are formed by ion-implanting the n-type impurity into the p-well 3 on both sides of the gate electrode 6.

Then, after an insulating film is formed on the overall surface of the silicon substrate 1, the insulating film is left as side wall insulating film 9 on both side of gate electrode 6 by etching back the insulating film. As the insulating film, a silicon oxide ($SiO_2$) is formed by the CVD (Chemical Vapor Deposition) method, for example.

Further, the n-type impurity is ion-implanted again into the p-well 3 by using the gate electrode 6 and the sidewall insulating films 9 as a mask, providing the LDD (Lightly Doped Drain) structure for the n-type impurity diffusion regions 4a, 4b.

The n-type MOSFET is constructed by the p-well 3, the gate electrode 6, the n-type impurity diffusion regions 4a, 4b formed on both sides of the gate electrode 6, etc.

Next, a refractory metal film such as a titanium (Ti) film, or the like is formed on the overall surface by the sputtering method to have a thickness of 30 nm. Then, an alloy consisting of silicon and titanium is formed on surfaces of the n-type impurity diffusion regions 4a, 4b by heating the titanium film at the temperature of about 700° C. in the $N_2$ atmosphere, and titanium silicide layers (conductor patterns) 8a, 8b are formed therein. Then, the unreacted titanium film is removed by the wet etching.

It should be noted that cobalt (Co) may be employed as the above refractory metal, and cobalt silicide layers may be formed in place of the titanium silicide layers 8a, 8b.

Then, a silicon oxide nitride (SiON) film of about 200 nm thickness is formed as a cover insulating film (underlying insulating film) 7 on the overall surface of the silicon substrate 1 by the plasma CVD method. Thereafter, a silicon oxide ($SiO_2$) film of about 600 nm thickness is formed as a first insulating film 10 on the underlying insulating film 7 by the plasma CVD method using the TEOS (Tetraethoxy silane) gas.

Then, a surface of the first insulating film 10 is planarized by polishing the first insulating film 10 by virtue of the CMP (Chemical Mechanical Polishing) method.

Next, steps required until a structure shown in FIG. 4B is formed will be explained hereunder.

First, a titanium film and a platinum (Pt) film are formed sequentially as a first conductive film 11 on the first insulating film 10 by the DC sputtering method. in this case, a thickness of the titanium film is set to about 10 to 30 nm, e.g., 20 nm, and a thickness of the platinum film is set to about 100 to 300 nm, e.g., 175 nm. This titanium film plays a role of improving the adhesiveness between the platinum film and the first insulating film 10 and a role of improving the crystallinity of the platinum film.

It should be noted that a film made of iridium, ruthenium, ruthenium oxide, strontium ruthenium oxide ($SrRuO_3$), or the like may be formed as the first conductive film 11.

Then, a PZT ($Pb(Zr_{1-x}Ti_x)O_3$) film is formed on the first conductive film 11 by the sputtering method to have a thickness of 100 to 300 nm, e.g., 240 nm. This film is used as a ferroelectric film 12.

Then, the silicon substrate 1 is put in the oxygen atmosphere, and then RTA (Rapid Thermal Annealing) process is applied to the PZT film constituting the ferroelectric film 12 at 725° C. for 20 second at the programming rate of 125° C./sec, for example. Thus, the crystallization process of the PZT film is carried out.

As the method of forming the ferroelectric film 12, there are the spin-on method, the sol-gel method, the MOD (Metal Organic Deposition) method, and the MOCVD method other than the above sputtering method. Also, as the material constituting the ferroelectric film 12, there are other PZT material such as PLZT (Lead Lanthanum Zirconate Titanate: $(Pb_{1-3x/2}La_x)(Zr_{1-y}Ti_y)O_3)$ that is formed by adding lanthanum (La) to PZT, PLCSZT that is formed by adding lanthanum (La), calcium (Ca), and strontium (Sr) to PZT, etc., bismuth (Bi) material such as $SrBi_2(Ta_xNb_{1-x})_2O_9$ (where $0<x\leqq1$), $Bi_4Ti_2O_{12}$, etc. other than PZT.

After the above ferroelectric film 12 is formed, an iridium oxide ($IrO_x$) film is formed as a second conductive film 13 thereon by the sputtering method to have a thickness of 100 to 300 nm, e.g., 200 nm. It should be noted that a platinum film or a strontium ruthenium oxide (SRO) film may be formed by sputtering as the second conductive film 13.

Then, as shown in FIG. 4C, first resist 23 patterned into the shape of the capacitor upper electrode is formed on the second conductive film 13. Then, the second conductive film 13 is patterned by using the first resist 23 as the etching mask. Thus, the second conductive film 13 left resultantly is used as a capacitor upper electrode 13a.

Then, after the first resist 23 is removed, the ferroelectric film 12 is annealed at the temperature of 650° C. for 60 minute in the oxygen atmosphere. This annealing is performed in order to recover the damage of the ferroelectric film 12 imparted when performing the sputtering and etching. Some annealings are performed for the same purpose in the later steps.

Thereafter, as shown in FIG. 4D, second resist 24 patterned into the shape of the capacitor dielectric film is formed on the upper electrode 13a. The ferroelectric film 12 is then patterned by using the second resist 24 as the etching mask. Thus, the ferroelectric film 12 left resultantly is used as a capacitor dielectric film 12a. Subsequently, the second resist 24 is removed, and then the capacitor dielectric film 12a is annealed at the temperature of 650° C. for 60 minute in the oxygen atmosphere.

Then, as shown in FIG. 4E, a third resist 25 patterned into the shape of the capacitor lower electrode is formed on the upper electrode 13a. Then, the first conductive film 11 is patterned by using the third resist 25 as an etching mask, whereby first conductive film 11 thus left is used as a capacitor lower electrode 11a. Then, the third resist 25 is removed, and the capacitor dielectric film 12a is annealed at the temperature of 650° C. for 60 minute in the oxygen atmosphere.

Then, as shown in FIG. 4F, an alumina ($Al_2O_3$) film 14 of 70 nm thickness is formed as a metal oxide film, which covers the first insulating film 10 and the capacitor Q, at the atmospheric temperature by the sputtering method. This alumina film 14 is formed to protect the capacitor dielectric film 12a, which is easily reduced, from the reducing substance such as hydrogen or the like and to prevent deterioration of the characteristic of the capacitor dielectric film 12a by the hydrogen. It is preferable to form this alumina film 14 on the first insulating film 10 as shown, as well as on the capacitor Q. When doing so, since the capacitor Q and the first insulating film 10 are covered continuously with the alumina film 14, entering of the hydrogen into the bottom side of the capacitor Q from the outside via the first insulating film 10 can be prevented.

It should be noted that a metal oxide film such as a PLZT film, a PZT film, a titanium oxide film, or the like may be employed in place of the alumina film 14.

Then, as shown in FIG. 4G, a silicon oxide film of about 1100 nm thickness is formed as a second insulating film 15 on the alumina film 14 by the plasma CVD method using the TEOS gas. Thereafter, the second insulating film 12 is polished by CMP method, thereby planalizing the surface thereof.

Then, as shown in FIG. 4H, fourth resist 16 is formed on the second insulating film 15 and then exposed/developed. Thus, hole forming windows 16a, 16b are formed over the n-type impurity diffusion regions 4a, 4b respectively.

Figure 6:
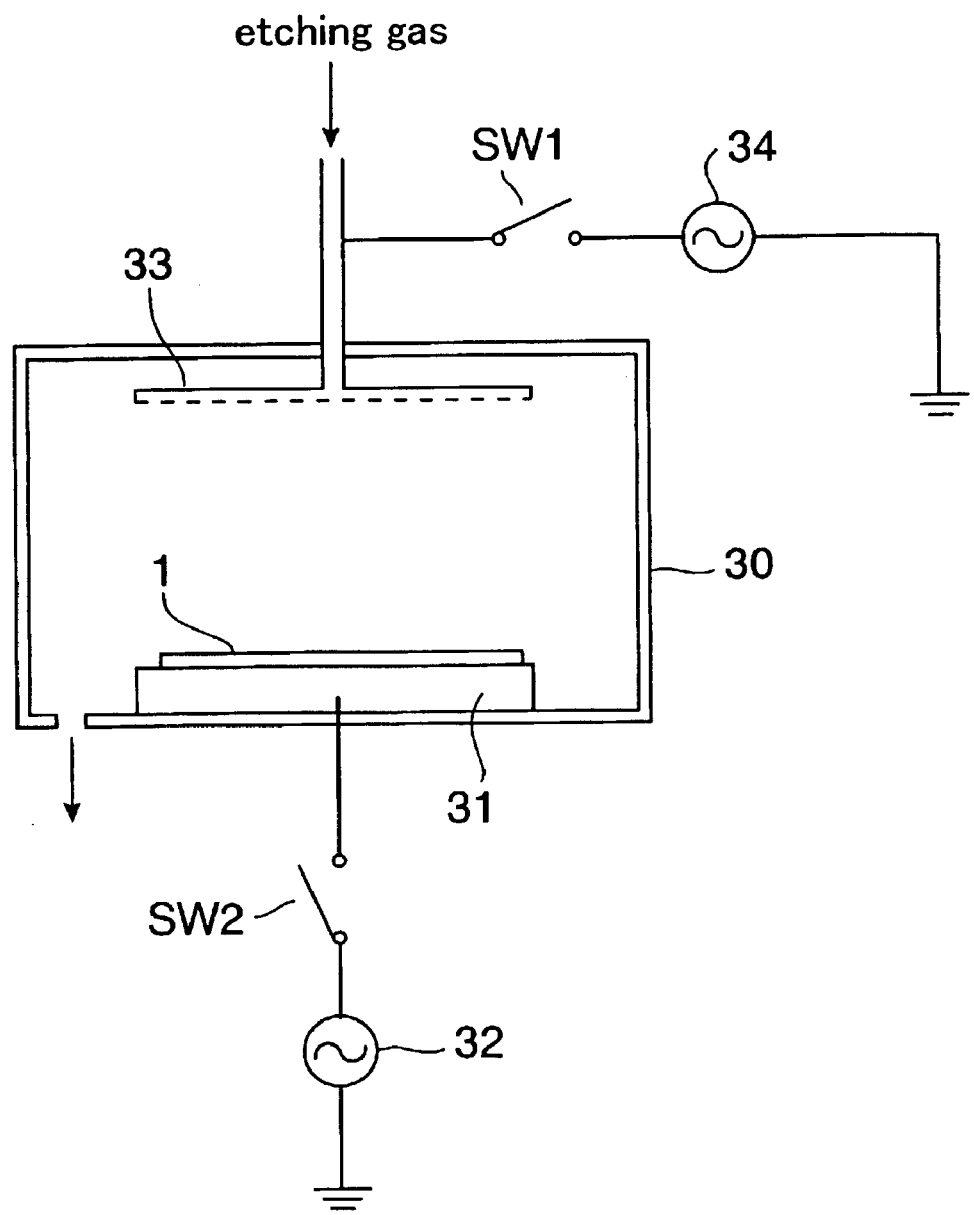
FIG. 6 is a configurative view showing the RIE equipment employed in the semiconductor device manufacturing method according to respective embodiments of the present invention.

Subsequently, the silicon substrate 1 is put on a substrate loading table 31 in an RIE chamber 30 shown FIG. 6. In the chamber 30, the substrate loading table 31 and a gas distributing plate 33 are arranged to oppose to each other, and a high-frequency power supply 34 and a low-frequency power supply 32 can be connected to them via switches SW1, SW2 respectively. Then, the first etching step is carried out under first etching conditions, given in the following, by making the switches SW1, SW2 into ON state.

Etching gas . . . $C_4F_8+O_2+Ar$ $C_4F_8$ flow rate . . . 20 sccm $O_2$ flow rate . . . 12 sccm Ar flow rate . . . 500 sccm Pressure in the chamber 30 . . . 50 mmTorr Temperature of the silicon substrate 1 . . . 0° C.

Frequency of the high-frequency power supply 34 . . . 27.12 MHz

Power of the high-frequency power supply 34 . . . 2000 W

Frequency of the low-frequency power supply 32 . . . 800 kHz

Power of the low-frequency power supply 32 . . . 800 W

As a result, as shown in FIG. 4I, the second insulating film 15, the alumina film 14, and the first insulating film 10 are etched selectively through the hole forming windows 16a, 16b, and thus holes 15a, 14a, 10a each having a diameter of about 25 μm are formed in these films. The first holes 27 are constructed by these holes 15a, 14a, 10a.

In the above first etching conditions, the etching rates of the first insulating film 10, the alumina film 14, and the second insulating film 15 are almost the same. In contrast, the etching rate of the cover insulating film 7 is as small as about 1/20 of the etching rates of films 10, 14, 15, which in turn makes the cover insulating film 7 serve as etching stopper film.

Because the cover insulating film 7 serves as the etching stopper film, variation in film thickness of the films 10, 14, 15 to be etched can be absorbed by setting the etching depth deeper than a total film thickness of the films 10, 14, 15. Thus, such a situation can be prevented that the holes 10a are not opened.

By the way, in the above etching, since the alumina film 14 is etched, the alumina reacts with the etching gas during the etching and thus reactant product is deposited on inner surfaces of the holes 16a, 16b, 15a, 14a, 10a, as depicted in FIG. 4I. It should be noted that the thickness of the reactant product is exaggerated in FIG. 4I.

In the subsequent step, though the cover insulating film 7 under the holes 10a is etched to form the holes therein, aforementioned problem will be arose wherein the selective etching ratio between the cover insulating film 7 made of the SiON film and the titanium silicide layers 8a, 8b cannot be ensured, when the etching is performed under the condition where the reactant product remains. In particular, this problem becomes pronounced when the amunina film 14 is formed thick and thus its etching amount increases and the amount of the reactant product increases.

In view of this, the present invention incorporates the cleaning step, in which the inside of the first hole 27 is cleaned in order to remove the reactant product. This cleaning step is executed by the wet process, in which either wt % $HNO_3$ aqueous solution or a 8.6 wt % phosphoric acid aqueous solution is used as the cleaning liquid. The temperature of these aqueous solutions is set to about 25° C. and the processing time is about one minute. Although not limited, the batch processing equipment is employed as the processing equipment in the present invention.

As the result of such cleaning, the reactant product is removed from the insides of the first holes 27, as shown in FIG. 4J.

It may be considered that the reactant product can be removed by dry process, in place of the wet process. However, since the first hole 27 is etched in an abnormal shape by applying the dry process, the dry process cannot be employed in the present invention.

Next, the silicon substrate 1 is loaded once again into the RIE chamber 30 shown in FIG. 6, and then the second etching step is carried out under the second etching conditions given in the following.

Etching gas . . . $C_4F_8+CF_4+O_2+Ar$
$C_4F_8$ flow rate . . . 20 sccm
$CF_4$ flow rate . . . 10 sccm
$O_2$ flow rate . . . 12 sccm
Ar flow rate . . . 500 scam
Pressure in the chamber 30 . . . 50 mmTorr
Temperature of the silicon substrate 1 . . . 0° C.
Frequency of the high-frequency power supply 34 27. 12 MHz
Power of the high-frequency power supply 34 . . . 2000 W
Frequency of the low-frequency power supply 32 . . . 800 kHz
Power of the low-frequency power supply 32 . . . 800 W The second etching conditions aims at the etching of the cover insulating film 7 via the first holes 27 (see FIG. 4K) and the increase of the selective etching ratio between the cover insulating film 7 and the underlying titanium silicide layers 8a, 8b. As already described above, it is carbon polymer generated from $C_4F_8$ and the like in the etching gas that plays a role of increasing the selective etching ratio.

According to the present embodiment, since the reactant product in the first etching step has already been removed prior to the second etching step, the oxygen is not supplied to the etching atmosphere from the reactant product. Hence, the above carbon polymer is not excessively oxidized by the oxygen, and thus reduction of the polymer amount in the etching atmosphere can be prevented. As a result, the selective etching ratio between the cover insulating film 7 and the underlying titanium silicide layers 8a, 8b can be increased, as intended above. Accordingly, as shown in a circle of FIG. 4K, the etching can be stopped desirably at the surface of the titanium silicide layer 8a, and thus second holes 7a, in which the titanium silicide layer 8a expose, can be formed in the cover insulating film 7 while preventing the etching of the titanium silicide layer 8a.

In addition, even when the large amount of reactant product is produced when the alumina film 14 is formed thick, such reactant product is removed as above, and thus the above advantage can be achieved irrespective of the film thickness of the alumina film 14. Specifically, the film thickness of the alumina film 14 is about 70 nm in the present embodiment and is thicker than that (20 nm to 60 nm) in the prior art, nevertheless the selective etching ratio of about 10 (=the etching rate of the cover insulating film 7/the etching rate of the titanium silicide layers 8a, 8b) can be obtained. This value is a considerably large value than the selective etching ratio (less than 2) obtained when the alumina film of 60 nm thickness is etched in the prior art.

Accordingly, in the present embodiment, an upper limit is not imposed on the film thickness of the alumina film 14. Hence, even when the capacitor Q is ready to deteriorate by the hydrogen during the process when the cell area is reduced in size, the deterioration of the capacitor Q can be prevented by forming the alumina film 14 thick.

According to the above, contact holes 18a, 18b each consisting of the holes 15a, 14a, 10a, and 7a are formed on the n-type impurity diffusion regions 4a, 4b.

In the meanwhile, in the above second etching conditions, though the selective etching ratio between the cover insulating film 7 and the underlying titanium silicide layers 8a, 8b can be increased, the selective etching ratio between the cover insulating film 7 and the second insulating film 15 (=the etching rate of the cover insulating film 7/the etching rate of the second insulating film 15) is small such as about ⅓. Therefore, unless the second etching step is carried out while protecting the upper surface of the second insulating film 15 by another film, the surface of the second insulating film 15 tends to be etched.

In view of this, in the present embodiment, the above cleaning step is executed in the situation that the fourth resist 16 remains, and subsequently the second etching step is executed while protecting the upper surface of the second insulating film 15 by the fourth resist 16. According to this, since the etching proceeds only below the hole forming windows 16a, 16b, it can be prevented that the upper surface of the second insulating film 15 is etched.

Alternatively, it may be considered that the cleaning step is carried out after the fourth resist 16 is removed. However, in this case, another resist must be formed again before the second etching step and then the hole forming windows are opened in the resist. In this case, alignment of the hole forming windows and the contact holes 18a, 18b becomes difficult, and thus such situation is not preferable.

Then, the fourth resist 16 is removed after the above steps. Then, as shown in FIG. 4L, a titanium film of about 20 nm thickness and a titanium nitride (TiN) film of about 50 nm thickness are formed on the second insulating film 15 and inner surfaces of the contact holes 18a, 18b by the sputtering method. These films are used as a glue film 20. Then, a tungsten film 19 is formed on the glue film 20 by the CVD method using a mixed gas consisting of tungsten hexafluoride ($WF_6$), argon, and hydrogen. In this case, a silane ($SiH_4$) gas is also used in the initial growth of the tungsten film 19. A thickness of the tungsten film 19 is set to bury perfectly the contact holes 18a, 18b, e.g., is set to about 500 nm on the second insulating film 15.

Then, as shown in FIG. 4M, the tungsten film 19 and the glue film 20 on the second insulating film 15 are removed by the CMP method and are left only in the contact holes 18a, 18b. Then, the tungsten film 19 and the glue film 20 left in the contact holes 18a, 18b are used as conductive plugs 19a, 19b respectively.

Then, as shown in FIG. 4N, a SiON film of 100 nm thickness, for example, is formed on the second insulating film 15 and the conductive plugs 19a, 19b by the plasma CVD method. This SiON film is formed by using a mixed gas consisting of silane ($SiH_4$) and $N_2O$, and is used as an oxidation-preventing insulating film 21 that prevents the oxidation of the conductive plugs 19a, 19b.

Then, as shown in FIG. 4O, a hole 18c reaching the upper electrode 13a of the capacitor Q is formed by patterning the oxidation-preventing insulating film 22, the second insulating film 15, and the alumina film 14 by virtue of the photolithography method.

Thereafter, film quality of the capacitor dielectric film 12a is improved by annealing the capacitor dielectric film 12a at 550° C. for 60 minute in the oxygen atmosphere. At this time, the oxidation of the conductive plugs 19a, 19b can be prevented by the oxidation-preventing insulating film 21.

Subsequently, as shown in FIG. 4P, the dry etching is applied to the oxidation-preventing insulating film 21 by using the CF gas. Then, surfaces of the conductive plugs 19a, 19b and the upper electrode 13a are etched by about 10 nm depth by the RF etching method to expose cleaned surfaces.

Then, as shown in FIG. 4Q, a conductive film having a quadruple-layered structure containing aluminum is formed on the second insulating film 15, the conductive plugs 19a, 19b, and the hole 18c by the sputter method. This conductive film consists, sequentially from the bottom, of a titanium nitride film of about 50 nm thickness, a copper-containing (0.5%) aluminum film of about 500 nm thickness, a titanium film of about 5 nm thickness, and a titanium nitride film of about 100 nm thickness.

Then, as also shown in FIG. 4Q, a first-layer metal wiring 22a and a conductive contact pad 22b are formed by patterning the conductive film by virtue of the photolithography method. Out of them, the first-layer metal wiring 22a is electrically connected to the upper electrode 13a via the hole 18c.

Thereafter, an insulating film (not shown) for covering the first-layer metal wiring 22a and the conductive contact pad 22b is formed. Then, a contact hole is formed on the conductive contact pad 22b by patterning the insulating film by means of the photolithography method, and then a conductive plug having the double-layered structure consisting of the TiN film and the tungsten film is formed therein. Thereafter, a second-layer metal wiring electrically connected to the conductive plug is formed on the insulating film.

According to the above embodiment, the holes are formed in the laminated film consisting of the first insulating film 10, the alumina film 14, and the second insulating film 15 in the first etching step, then the reactant product deposited in the holes is cleaned in the cleaning step, and then the underlying cover insulating film 7 is etched via the holes in the second etching step.

According to this, even if the alumina film 14 is formed thick and large amount of reactant product generates, such reactant product is removed. Thus, the oxygen is not supplied to the etching atmosphere from the reactant product in the second etching step. Therefore, it can be prevented that the carbon polymer in the etching atmosphere is excessively oxidized by the oxygen and thus reduction of an amount of the carbon polymer is caused. As a result, because of the function of the above polymer, the selective etching ratio between the cover insulating film 7 and the underlying titanium silicide layers 8a, 8b can be ensured sufficiently largely in the second etching step, regardless of the film thickness of the alumina film 14.

Accordingly, even when the cell area of the capacitor Q is reduced and the alumina film 14 is formed thick, the titanium silicide layers 8a, 8b can be prevented from being etched. Thus, such an event can be prevented that the contact resistance between respective conductive plugs 19a, 19b and the titanium silicide layers 8a, 8b varies for each conductive plug. This can largely contribute to the miniaturization of the FeRAM.

Also, since the cleaning step is carried out in the state that the fourth resist 16 still remains and subsequently the second etching step is carried out by using the fourth resist 16 as an etching mask, the etching of the upper surface of the second insulating film 15 in the second etching step can be prevented. In addition, according to this, unlike the case that the fourth resist 16 is removed before the cleaning step or before the second etching step, there is no need to form another resist on the second insulating film 15 and form the hole forming window therein, and to perform the positional alignment between the hole forming window and the contact holes 18a, 18b.

(2) Second Embodiment

Next, a second embodiment of the present invention will be explained with reference to FIGS. 5A to 5D hereinafter. A difference of the present embodiment from the first embodiment resides only in the step of forming the alumina film, and other steps are similar to those in the first embodiment. Therefore, only the step of forming the alumina film will be explained in the following. The same symbols as those in the first embodiment are affixed to the members explained in the first embodiment, and their explanation will be omitted herein.

Figure 5A:
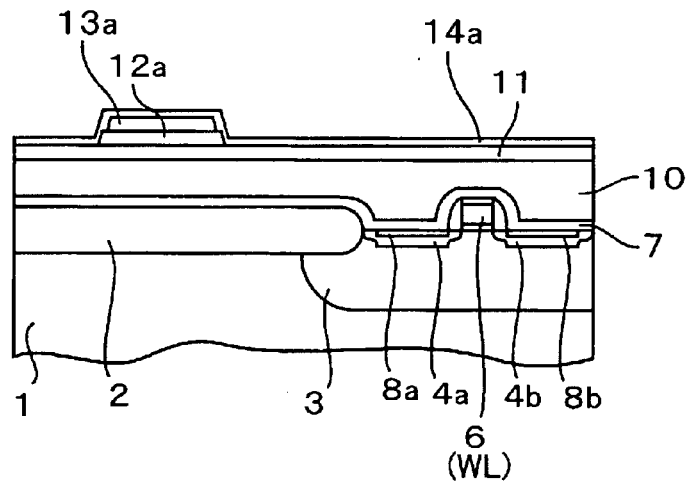
FIGS. 5A to 5D are sectional views showing a semiconductor device manufacturing method according to a second embodiment of the present invention.

First, after the step in FIG. 4D is completed, as shown in FIG. 5A, a first alumina film (first metal oxide film) 14a for covering the capacitor upper electrode 13a, the capacitor dielectric film 12a, and the first conductive film 11 is formed at the atmospheric temperature by the sputtering method to have a thickness of about 50 nm.

Thereafter, the film quality of the capacitor dielectric film 12a is improved by applying the RTA (Rapid Thermal Annealing) process to the capacitor dielectric film 12a under the first alumina film 14a at 700° C. for 60 second at the programming rate of 125° C./sec.

Figure 5B:
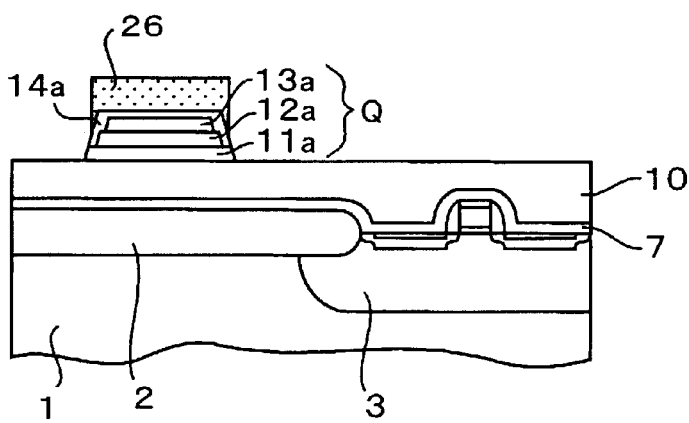

Then, as shown in FIG. 5B, a fifth resist 26 patterned into the shape of the capacitor lower electrode is formed on the first alumina film 14a. Then, the first alumina film 14a and the first conductive film 11 are patterned by the etching while using the fifth resist 26 as the etching mask. This etching is carried out by the dry etching using chlorine as the etching gas.

Then, the patterned first conductive film 11 is used as the capacitor lower electrode 11a, and also the first alumina film 14a is left at least on side surfaces of the capacitor dielectric film 12a and on the capacitor upper electrode 13a. Thus, the capacitor that is constructed by laminating the capacitor lower electrode 11a, the capacitor dielectric film 12a, and the capacitor upper electrode 13a is formed on the first insulating film 10.

Since the side surfaces of the capacitor dielectric film 12a are covered with the first alumina film 14a in this etching, particles of platinum, or the like, which are generated at the time of etching of the first conductive film 11, can be prevented from adhering onto the side surfaces, and thus electrical short-circuit between the capacitor lower electrode 11a and the capacitor upper electrode 13a by such particles can be prevented.

Figure 5C:
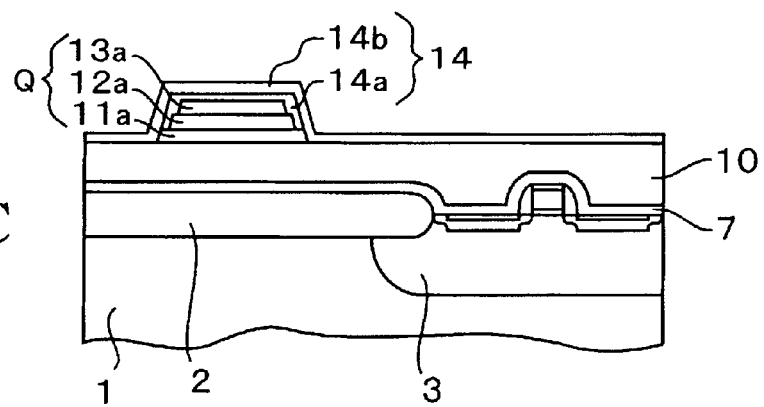

Then, as shown in FIG. 5C, a second alumina film (second metal oxide film) 14b for covering the capacitor Q is formed on the first alumina film 14a and the first insulating film 10 at the atmospheric temperature by the sputtering method to have a thickness of about 20 nm. The second alumina film 14b and the first alumina film 14a are employed as the alumina film 14.

According to this, the alumina film 14 has the double-layered structure consisting of the first alumina film 14a and the second alumina film 14b on the capacitor Q. Therefore, entering of the hydrogen into the capacitor dielectric film 12a becomes difficult much more rather than the first embodiment, and thus the deterioration of the capacitor dielectric film 12a can be prevented more surely.

It should be noted that any one of the PLZT film, the PZT film, and the titanium oxide film may be employed in place of both films of the first alumina film 14a and the second alumina film 14b.

Figure 5D:
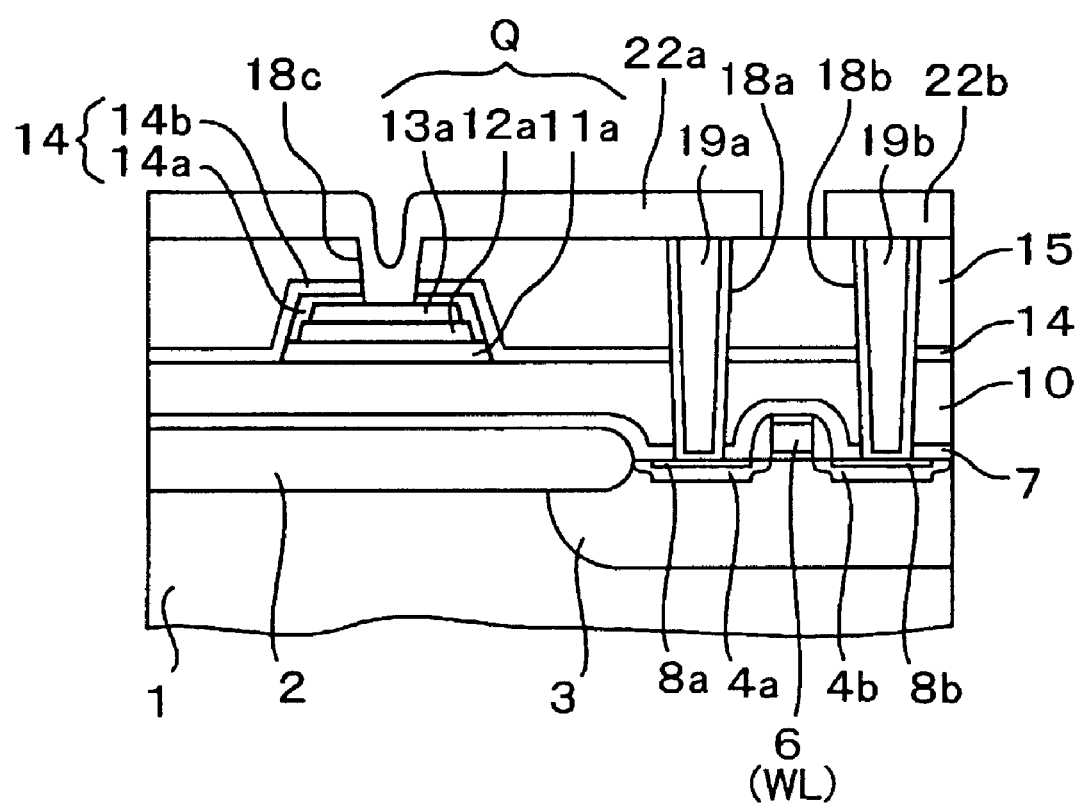

After this, a structure shown in FIG. 5D is completed by executing steps subsequent to the steps in FIG. 4G, which have already been described.

In the above second embodiment, the advantages similar to those in the first embodiment can also be achieved.

Although the embodiments of the present invention are explained in detail, the present invention is not limited to the above embodiments. For example, though the contact holes 18a, 18b over the source/drain regions of the MOSFET are considered in the above, the present invention may be applied to the hole formed on the gate electrode 6 having the polycide structure to bury the conductive plugs (not shown). This hole passes through the second insulating film 15, the alumina film 14, the first insulating film 10, and the cover insulating film 7 to reach the tungsten silicide layer. By applying the present invention to such a structure, the selective etching ratio between the tungsten silicide layer and the cover insulating film 7 can be ensured sufficiently largely.

As described above, according to the present invention, the hole is formed in the underlying insulating film after the reactant product generated when etching the metal oxide film is removed by the cleaning. Therefore, even when the cell area of the FeRAM is reduced and thus the metal oxide film is formed thick, the selective etching ratio between the underlying insulating film and the lower conductor pattern can be ensured largely and thus it can be prevented that the conductor pattern is etched. As a result, it can be prevented that the contact resistance between the conductive plug, which is buried in the hole, and the conductive pattern is varied every conductive plug. This can largely contribute to the miniaturization of the FeRAM.

Also, the resist pattern is formed on the laminated film containing the metal oxide film, then the first holes are formed in the laminated film in the first etching step by using the resist pattern as the etching mask, and then the cleaning step of the inside of the first hole and the second etching step of the underlying insulating film are carried out in the state that the resist pattern still remains. Therefore, the etching of the upper surface of the laminated film in the second etching step can be prevented. In addition, since the resist pattern is not removed before the cleaning step and before the second etching step, it is not needed that another resist pattern for the second etching step should be formed once again.

Further, since the above metal oxide film is formed to have the double-layered structure consisting of the first metal oxide film and the second metal oxide film, the entering of the hydrogen into the capacitor can be prevented more surely. In addition, when such metal oxide film having the double-layered structure is formed, the first conductive film is patterned into the capacitor lower electrode under the condition where the side surfaces of the capacitor dielectric film are covered with the first metal oxide film in this etching. Therefore, particles that are generated at the time of etching can be prevented from adhering onto the side surfaces of the capacitor dielectric film, and thus the electrical short-circuit between the capacitor lower electrode and the capacitor upper electrode caused by such particles can be prevented.

What is claimed is:

1. A method of manufacturing a semiconductor device comprising the steps of:
    forming conductive pattern made of alloy consisting of semiconductor and refractory metal on a semiconductor substrate;
    forming an underlying insulating film that covers the conductive pattern;
    forming a laminated film, containing a metal oxide film therein, on the underlying insulating film;
    a first etching step of forming a first hole in the laminated film over the conductive pattern by selectively etching the laminated film under first etching conditions;
    a cleaning step of cleaning the first hole; and
    a second etching step of forming a second hole in the underlying insulating film to expose the conductive pattern by selectively etching the underlying insulating film via the first hole under second etching conditions after the cleaning step.

2. A method according to claim 1, wherein the first etching step is executed by forming a resist pattern on the laminated film and then selectively etching the laminated film while using the resist pattern as an etching mask, and
    the cleaning step and the second etching step are executed in a state where the resist pattern remains.

3. A method according to claim 1, wherein the cleaning step is executed by exposing an inner wall of the first hole to a cleaning liquid.

4. A method according to claim 3, wherein the cleaning liquid is a nitric acid aqueous solution or a phosphoric acid aqueous solution.

5. A method according to claim 1, wherein the step of forming the laminated film includes the steps of:
    forming a first insulating film on the underlying insulating film;
    forming a capacitor, which is constructed by laminating sequentially a capacitor lower electrode, a capacitor dielectric film, and a capacitor upper electrode, on the first insulating film; and
    forming the metal oxide film that covers the capacitor and the first insulating film, and
    the first etching step forms the first hole out of the capacitor.

6. A method according to claim 1, wherein forming the laminated film includes the steps of:
    forming a first insulating film on the underlying insulating film;
    forming sequentially a first conductive film, a ferroelectric film, and a second conductive film on the first insulating film;
    patterning the second conductive film into a capacitor upper electrode;
    patterning the ferroelectric film into a capacitor dielectric film;
    forming a first metal oxide film that covers the capacitor upper electrode, the capacitor dielectric film, and the first conductive film;
    patterning the first metal oxide film and the first conductive film to make the first conductive film into a capacitor upper electrode and to leave the first metal oxide film at least on side surface of the capacitor dielectric film and on the capacitor upper electrode, and to form a capacitor that is constructed by sequentially laminating the capacitor upper electrode, the capacitor dielectric film, and the capacitor lower electrode; and
    forming a second metal oxide film, which covers the capacitor, on the first metal oxide film and the first insulating film, whereby the first metal oxide film and the second metal oxide film are used as the metal oxide film, and
    the first etching step forms the first hole out of the capacitor.

7. A method according to claim 1, wherein conditions under which an etching rate of the laminated film becomes higher than an etching rate of the underlying insulating film are employed as the first etching conditions.

8. A method according to claim 7, wherein a mixed gas consisting of $C_4F_8$, $O_2$, and Ar is employed as an etching gas in the first etching conditions, and the first etching step is executed by RIE.

9. A method according to claim 1, wherein conditions under which an etching rate of the underlying insulating film becomes higher than an etching rate of the conductive pattern are employed as the second etching conditions.

10. A method according to claim 9, wherein a mixed gas consisting of $C_4F_8$, $CF_4$, $O_2$, and Ar is employed as an etching gas in the second etching conditions, and the second etching step is executed by RIE.

11. A method according to claim 1, further comprising the step of:

forming conductive plug, which are electrically connected to the conductive pattern, in the first hole and the second hole.

12. A method according to claim 1, wherein any one of an alumina film, a PLZT film, a PZT film, and a titanium oxide film is employed as the metal oxide film.

13. A method according to claim 1, wherein silicide is employed as the conductive pattern.

14. A method according to claim 13, wherein the silicide is formed on a source/drain region of a MOSFET.

15. A method according to claim 13, wherein any one of titanium silicide and cobalt silicide is employed as the silicide.

16. A method according to claim 14, wherein any one of titanium silicide and cobalt silicide is employed as the silicide.

17. A method according to claim 1, wherein a silicon oxide nitride film is employed as the underlying insulating film.

* * * * *